US009623633B2

(12) United States Patent
Kim et al.

(10) Patent No.: US 9,623,633 B2
(45) Date of Patent: Apr. 18, 2017

(54) FLEXIBLE DISPLAY AND METHOD FOR MANUFACTURING THE SAME

(71) Applicant: SAMSUNG DISPLAY CO., LTD., Yongin, Gyeonggi-Do (KR)

(72) Inventors: Tae-Woong Kim, Yongin (KR); Sung-Guk An, Yongin (KR); Dong-un Jin, Yongin (KR); Hyung-Sik Kim, Yongin (KR); Young-Gu Kim, Yongin (KR); Sang-Joon Seo, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 229 days.

(21) Appl. No.: 14/064,630

(22) Filed: Oct. 28, 2013

(65) Prior Publication Data
US 2014/0050933 A1 Feb. 20, 2014

Related U.S. Application Data

(63) Continuation of application No. 12/870,340, filed on Aug. 27, 2010, now abandoned.

(30) Foreign Application Priority Data

Aug. 28, 2009 (KR) .................. 10-2009-0080769

(51) Int. Cl.
*B05D 5/12* (2006.01)
*B32B 15/08* (2006.01)
(Continued)

(52) U.S. Cl.
CPC ................ *B32B 15/08* (2013.01); *B05D 1/36* (2013.01); *B05D 5/12* (2013.01); *B32B 9/045* (2013.01); *H01L 51/003* (2013.01); *H01L 51/52* (2013.01); *H01L 51/5256* (2013.01); *H01L 2227/326* (2013.01); *H01L 2251/5338* (2013.01);
(Continued)

(58) Field of Classification Search
USPC .......................................................... 427/66
See application file for complete search history.

(56) References Cited

U.S. PATENT DOCUMENTS 5,258,236 A 11/1993 Arjavalingam et al.
6,127,199 A * 10/2000 Inoue et al. ..................... 438/30
(Continued)

FOREIGN PATENT DOCUMENTS

CN 101236897 A 8/2008
JP 1-243545 A 9/1989
(Continued)

*Primary Examiner* — Austin Murata
(74) *Attorney, Agent, or Firm* — Lee & Morse, P.C.

(57) ABSTRACT

A flexible display comprises a flexible substrate made of plastic material, a display element on a first surface of the flexible substrate, and a surface residual film containing at least one of a metal material or a metal oxide material. The surface residual film is bonded to at least a part of a second surface of the flexible substrate. The second surface is opposed to the first surface. A method for manufacturing a flexible display comprises preparing a glass substrate, forming adhesive material film on the glass substrate, the adhesive material film being made of at least one of a metal material or a metal oxide material, and forming a flexible substrate from plastic material on the adhesive material film.

12 Claims, 7 Drawing Sheets

(51) Int. Cl.
  *H01L 51/52*    (2006.01)
  *B05D 1/36*    (2006.01)
  *B32B 9/04*    (2006.01)
  *H01L 51/00*    (2006.01)

(52) U.S. Cl.
  CPC ........ *Y10T 156/1158* (2015.01); *Y10T 428/10* (2015.01); *Y10T 428/265* (2015.01); *Y10T 428/266* (2015.01); *Y10T 428/31678* (2015.04); *Y10T 428/31721* (2015.04)

(56) References Cited

U.S. PATENT DOCUMENTS

| | | | |
|---|---|---|---|
| 6,372,608 | B1 | 4/2002 | Shimoda et al. |
| 6,991,751 | B2 | 1/2006 | Fukushima et al. |
| 7,285,476 | B2 | 10/2007 | Shimoda et al. |
| 2003/0082925 | A1* | 5/2003 | Yano .................... G03F 7/0387 438/778 |
| 2004/0070724 | A1* | 4/2004 | Shinozaki ............ G02F 1/1508 349/187 |
| 2004/0096773 | A1* | 5/2004 | Jung et al. ................. 430/270.1 |
| 2006/0030122 | A1* | 2/2006 | Shimoda et al. ............. 438/455 |
| 2006/0249773 | A1* | 11/2006 | Kai .................. H01L 21/02178 257/301 |
| 2007/0059854 | A1* | 3/2007 | Huang .............. G02F 1/133305 438/30 |
| 2007/0278947 | A1* | 12/2007 | Sakata .......................... 313/506 |
| 2007/0281091 | A1* | 12/2007 | Kowalski et al. ............ 427/256 |
| 2008/0179594 | A1* | 7/2008 | Oh ....................... H01L 27/1214 257/59 |
| 2008/0193796 | A1* | 8/2008 | Arakane ................. C09K 11/06 428/690 |
| 2008/0311361 | A1 | 12/2008 | Lee et al. |
| 2009/0004772 | A1* | 1/2009 | Jinbo ................. H01L 29/66969 438/99 |
| 2009/0195150 | A1 | 8/2009 | Chen et al. |
| 2009/0211885 | A1* | 8/2009 | Steeneken .......... H01H 59/0009 200/181 |
| 2009/0323009 | A1 | 12/2009 | Paek et al. |
| 2011/0204561 | A1* | 8/2011 | Ishioka .................. B65H 5/062 271/226 |

FOREIGN PATENT DOCUMENTS

| | | |
|---|---|---|
| JP | 10-335624 | 12/1998 |
| JP | 2004-091750 A | 3/2004 |
| JP | 2006-203220 A | 8/2006 |
| JP | 2006-253106 A | 9/2006 |
| JP | 2007-12781 A | 1/2007 |
| JP | 2008-134594 A | 6/2008 |
| JP | 2008-211191 A | 9/2008 |
| JP | 2009-76852 A | 4/2009 |
| KR | 10-2005-0064883 A | 6/2005 |
| KR | 10-2005-0080539 A | 8/2005 |
| KR | 10-2006-0024127 A | 3/2006 |
| KR | 10-2007-0059794 A | 6/2007 |
| KR | 10-0822210 B1 | 4/2008 |
| KR | 10-2008-0065210 A | 7/2008 |
| KR | 10-2008-0073941 A | 8/2008 |
| TW | 565815 | 12/2003 |
| TW | 1262345 | 9/2006 |
| TW | 2007 12607 | 4/2007 |
| TW | 200934286 | 8/2009 |
| WO | WO 2008/050300 A1 | 5/2008 |
| WO | WO 2008/084956 | 7/2008 |
| WO | WO 2009/057797 * | 3/2009 |
| WO | WO-2009/104371 A1 | 8/2009 |

* cited by examiner

FLEXIBLE DISPLAY AND METHOD FOR MANUFACTURING THE SAME

CROSS REFERENCE TO RELATED APPLICATION(S)

This is a continuation application based on pending application Ser. No. 12/870,340, filed Aug. 27, 2010, the entire contents of which is hereby incorporated by reference.

BACKGROUND

1. Field

The embodiments relate to a flexible display and a method for manufacturing the same. More particularly, the embodiments relate to a flexible display which can be stably formed and a method for manufacturing the same.

2. Description of the Related Art

In recent years, flexible displays having a lightweight and shock-resistant flexible substrate made of materials such as plastics have been developed. Portability of such flexible displays can be maximized since they can be folded or rolled up. Also, such flexible displays can be applied in various fields.

A flexible display includes a display element formed on a flexible substrate. Different types of display elements may be used in a flexible display, including an organic light emitting diode display device, a liquid crystal display device, and an electrophoretic display (EPD) device, etc.

These types of display elements commonly include thin film transistors. Accordingly, in order to form a flexible display, the flexible substrate undergoes a number of thin film processes to form thin film transistors.

Since the flexible substrate generally has a relatively thin thickness of several tens of micrometers, it was difficult to perform a number of thin film processes separately on the flexible substrate. Currently, a method in which a flexible substrate is firstly formed on a glass substrate, a display element is formed on the flexible substrate adhered to the glass substrate, and then the flexible substrate and the glass substrate are separated from each other is used to perform thin film processes.

A flexible substrate made of plastic material generally has a coefficient of thermal expansion (CTE) that is different from the CTE of the glass substrate. If the adhesion force between the flexible substrate and the glass substrate is weak, then the flexible substrate may peel off and away from the glass substrate or be partly removed and bent during a high-temperature process. This may cause a fatal defect in the manufacturing process of a flexible display.

The above described information is only for enhancement of understanding of the background of the described technology. Therefore, it may contain information that does not form the prior art that is already known in this country to a person of ordinary skill in the art.

SUMMARY

Embodiments are therefore directed to a flexible display, which can be stably formed, and a method for manufacturing the same, which substantially overcome one or more of the problems due to the limitations and disadvantages of the related art.

It is therefore a feature of an embodiment to provide a flexible display, comprising a flexible substrate made of plastic material, a display element on a first surface of the flexible substrate, and a surface residual film containing at least one of a metal material or a metal oxide material, the surface residual film being bonded to at least a part of a second surface of the flexible substrate, the second surface of the flexible substrate being opposed to the first surface.

The plastic material may include a functional group of —CONH—.

The flexible substrate may be formed from a material containing a polyimide.

The flexible substrate may have a thickness ranging from 5 μm to 200 μm.

The flexible substrate may have a coefficient of thermal expansion ranging from 3 ppm/° C. to 10 ppm/° C.

The surface residual film may contain a material bonded to the functional group of —CONH—.

The metal material may be bonded to the functional group of —CONH—, and the metal material may include at least one of aluminum, gallium, indium, titanium, molybdenum, and zinc.

The metal oxide material may be bonded to the functional group of —CONH—, and the metal oxide material may include at least one of aluminum oxide, gallium oxide, zinc oxide, titanium oxide, indium oxide, indium tin oxide, indium zinc oxide, and gallium indium zinc oxide.

The display element may include a thin film transistor.

The display element may be an organic light emitting diode display device, a liquid crystal display device, or an electrophoretic display device.

The surface residual film may have a thickness ranging from 0.1 nm to 1000 nm.

It is therefore another feature of an embodiment to provide a method for manufacturing a flexible display, comprising: preparing a glass substrate; forming adhesive material film on the glass substrate, the adhesive material film being made of at least one of metal material and metal oxide material; and forming a flexible substrate from plastic material on the adhesive material film.

The plastic material may include a functional group of —CONH—.

The flexible substrate may be formed from material containing polyimide.

The flexible substrate may be formed by a slit coating method or a screen printing method.

The flexible substrate has a thickness ranging from 5 μm to 200 μm.

The flexible substrate may have the same coefficient of thermal expansion as the glass substrate.

The flexible substrate may have a coefficient of thermal expansion of less than 10 ppm/° C.

The adhesive material film may contain material capable of being bonded to the functional group of —CONH—.

The metal material may be bonded to the functional group of —CONH—, and the metal material may include at least one of aluminum, gallium, indium, titanium, molybdenum, and zinc.

The metal oxide material may be bonded to the functional group of —CONH—, and the metal oxide material may include at least one of aluminum oxide, gallium oxide, zinc oxide, titanium oxide, indium oxide, indium tin oxide, indium zinc oxide, and gallium indium zinc oxide.

The adhesive material film may be formed by atomic layer deposition.

The adhesive material film may have a thickness ranging from 0.1 nm to 1000 nm.

The method may further comprise separating the flexible substrate and the glass substrate from each other.

The flexible substrate and the adhesive material film may be separated from each other by radiation of laser light.

The adhesive material film and the glass substrate may be separated from each other by radiation of laser light.

The method may further comprise forming a display element on the flexible substrate.

The display element may include a thin film transistor.

The display element may be any one of an organic light emitting diode display device, a liquid crystal display device, and an electrophoretic display device.

According to embodiments, the flexible display may effectively suppress occurrence of a defect.

Furthermore, the method for manufacturing a flexible display according to embodiments can stably manufacture the above-described flexible display by effectively improving bonding force between the flexible substrate and the glass substrate.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
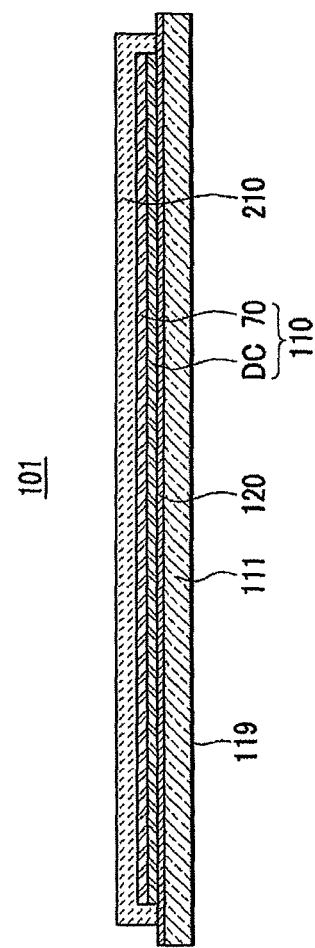
FIG. 1 illustrates a cross-sectional view of a flexible display according to an exemplary embodiment.

Korean Patent Application No. 10-2009-0080769, filed on Aug. 28, 2009, in the Korean Intellectual Property Office, and entitled: "Flexible Display and Method for Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, an exemplary embodiment will be described with reference to FIG. 1.

A flexible display 101 may include a flexible substrate 111, a display element 110 formed on a first surface of the flexible substrate 111, and a surface residual film 119 bonded to at least a part of a second surface of the flexible substrate 111. As used herein, the second surface of the flexible substrate 111 refers to the surface on the other side or opposite side of the flexible substrate relative to the first surface on which the display element 110 is formed.

The flexible substrate 111 may be made of plastic material. Specifically, the flexible substrate 111 may be made of plastic material containing a functional group of —CONH—. For example, the plastic material may be a polyimide containing the functional group of —CONH—. Polyimides exhibit excellent heat resistance characteristics, and since the flexible display 101 undergoes a high-temperature process, polyimides are highly suitable as a raw material in making the flexible substrate 111.

The flexible substrate 111 may have a thickness ranging from 5 μm to 200 μm. If the flexible substrate 111 has a thickness of less than 5 μm, it may be difficult for the flexible substrate 111 to stably support the display element 110. Moreover, it may be difficult to form the flexible substrate 111 to have a thickness less than 5 μm. On the other hand, if the flexible substrate 111 has a thickness greater than 200 μm, the overall thickness of the flexible display device 101 may be too large, and its flexibility characteristics may be deteriorated.

The flexible substrate 111 may be formed to have a CTE ranging from 3 ppm/° C. to 10 ppm/° C. If the CTE of the flexible substrate 111 is less than 3 ppm/° C. or greater than 10 ppm/° C., a difference in a CTE between a glass substrate 900 (shown in FIGS. 4 to 7) and the flexible substrate 111 may be too large. It is important that the flexible substrate 111 and the glass substrate 900 be stably bonded to each other. However, because of such a large difference in CTE between the flexible substrate 111 and the glass substrate 900, the flexible substrate 111 may peel off and away from the glass substrate 900 during a high-temperature process, and a fatal defect may be caused.

In accordance with embodiments, a surface residual film 119 may be bonded to the functional group of —CONH— contained in the flexible substrate 111. The surface residual film 119 may contain at least one of a metal material or a metal oxide material. That is, the at least one metal material or metal oxide material contained in the surface residual film 119 may be bonded to the functional group of —CONH— contained in the flexible substrate 111.

The metal material may include at least one of aluminum (Al), gallium (Ga), indium (In), titanium (Ti), molybdenum (Mo), and zinc (Zn).

The metal oxide material may include at least one of aluminum-oxide, gallium oxide, zinc oxide, titanium oxide, indium oxide, indium tin oxide (ITO), indium zinc oxide (IZO), and gallium indium zinc oxide (GIZO).

The at least one metal material or metal oxide material contained in the surface residual film 119 may serve to improve bonding force between the flexible substrate 111 and the glass substrate 900 in the manufacturing process of the flexible display 101. That is, the at least one metal material or metal oxide material contained in the surface residual film 119 may be firmly bonded to the flexible substrate 111. Such firm bonding may effectively suppress or prevent the flexible substrate 111 from peeling off or away from the glass substrate 900.

After the display element 110 is formed on the flexible substrate 111, the flexible substrate 111 and the glass substrate 900 may be separated from each other. At this point, at least a part of the metal material or metal oxide material contained in the surface residual film 119 between the flexible substrate 111 and the glass substrate 900 may be bonded to both of the flexible substrate 111 and the glass substrate 900. Accordingly, this part of the metal material or metal oxide material contained in the surface residual film 119 may remain between the flexible substrate 111 and the glass substrate 900.

The display element 110 may be any one of an organic light emitting diode display device, a liquid crystal display device, and an EPD device. These display elements commonly include thin film transistors (TFTs). Thus, in order to manufacture the flexible display 101, a number of thin film processes have to be carried out.

FIG. 1 illustrates a flexible display 101 that uses an organic light emitting diode display device as the display element 110. However, embodiments are not limited to this embodiment.

Hereinafter, the overall configuration of the flexible display 101 will be described in detail by referring to the flexible display 101 using an organic light emitting diode display device as the display element 110.

The display element 110 may include an organic light emitting diode 70 and a driving circuit DC. The driving circuit DC may include TFTs 10 and 20 (shown in FIG. 2). The driving circuit DC may be configured to drive the organic light emitting diode 70. That is, the organic light emitting diode 70 may emit light in response to a driving signal transmitted from the driving circuit DC to display an image.

Figure 2:
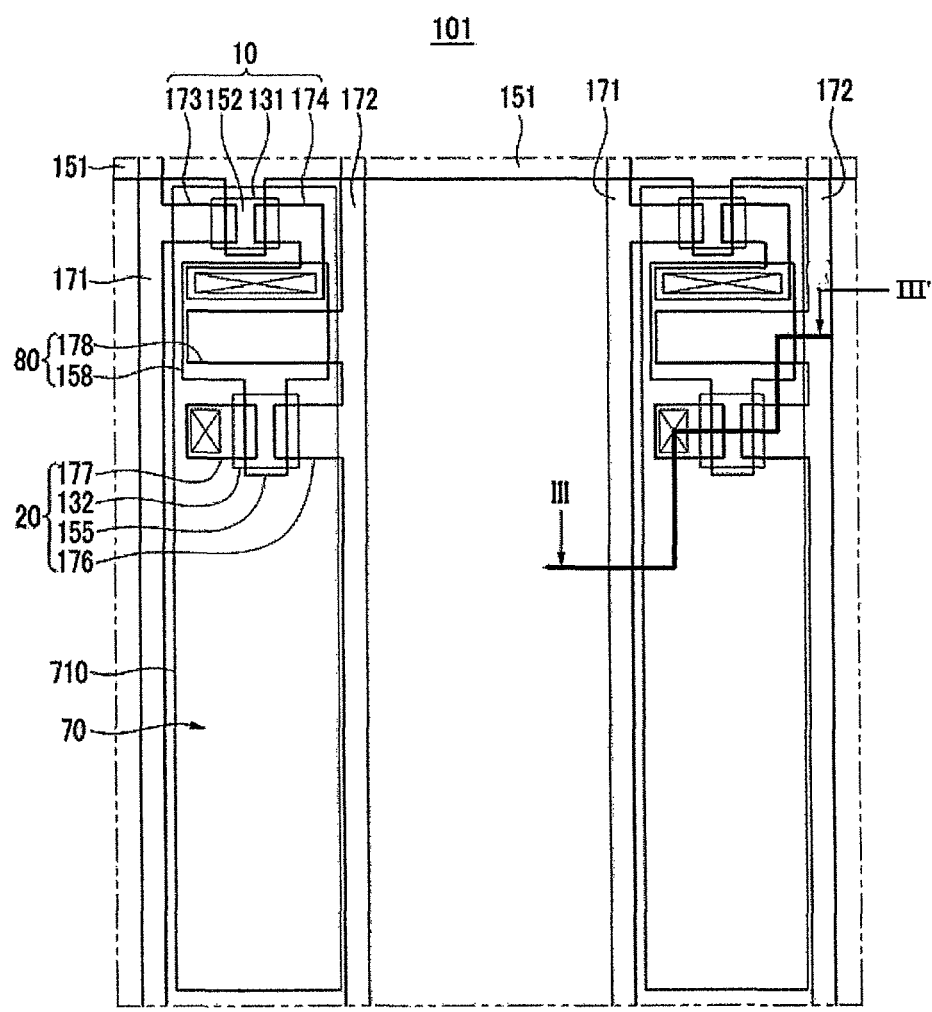
FIG. 2 illustrates an enlarged layout view of pixels in the flexible display illustrated in FIG. 1.
Figure 3:
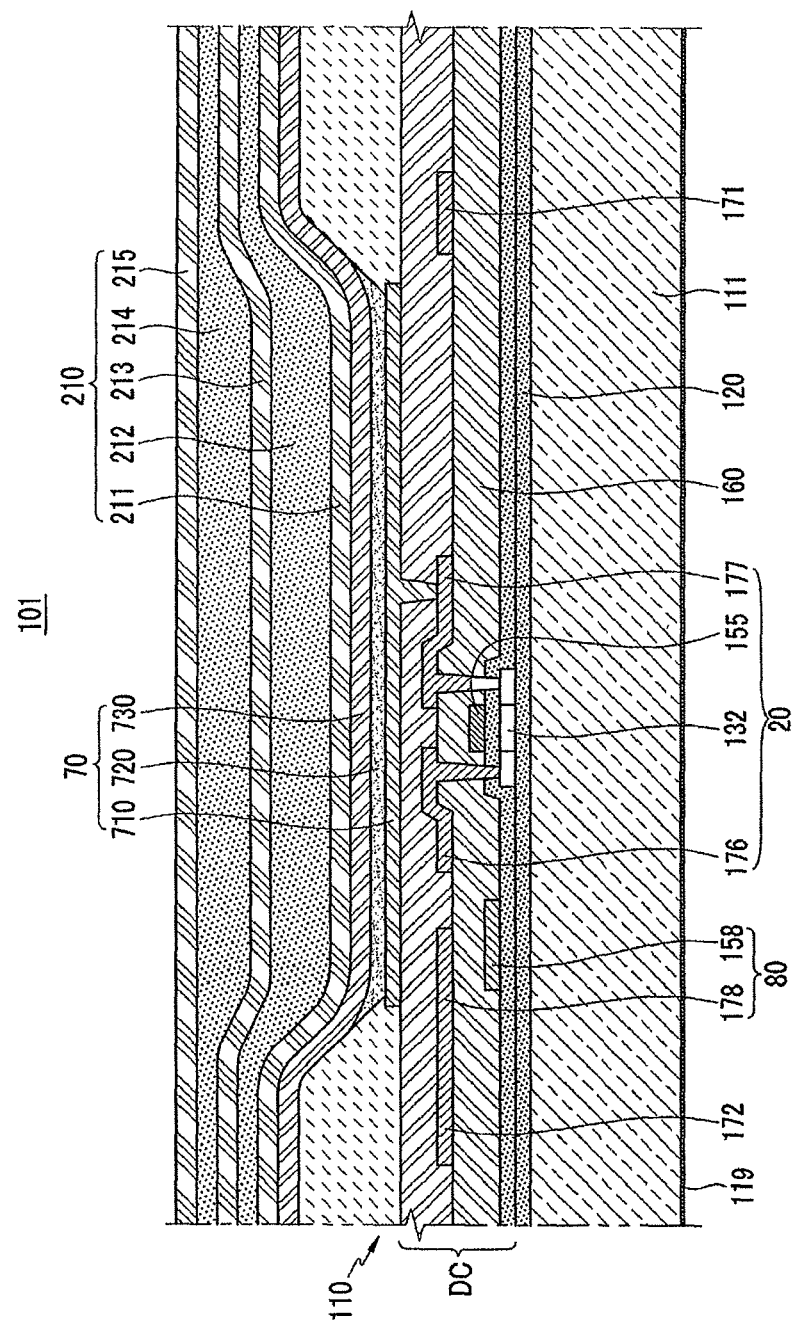
FIG. 3 illustrates a cross-sectional view of a pixel along line illustrated in FIG. 2.

An exemplary configuration of the driving circuit DC and the organic light emitting diode 70 are illustrated in FIGS. 2 and 3. However, embodiments are not limited to the configurations illustrated in FIGS. 2 and 3. Various configurations of the driving circuit DC and the organic light emitting diode 70 may be formed, and modifications to these configurations are within the purview of those of ordinary skill in the art.

Hereinafter, referring to FIGS. 2 and 3, an internal configuration of the flexible display 101 having the organic light emitting diode 70 will be described in detail. FIG. 2 illustrates a layout view of pixels in the flexible display. FIG. 3 illustrates a cross-sectional view of a pixel along line shown in FIG. 2.

FIGS. 2 and 3 illustrate an active matrix (AM)-type organic light emitting diode display 101 having a 2Tr-1Cap structure in which each pixel includes two TFTs 10 and 20 and one capacitor 80. However, embodiments are not limited this embodiment. The flexible display 101 may be configured so that each pixel includes three or more TFTs and two or more capacitors. Also, the flexible display 101 may have various configurations by forming additional wiring. Here, a pixel refers to the smallest unit that is configured to display an image, and is disposed in each pixel area. The flexible display 101 displays an image through a plurality of pixels.

As illustrated in FIG. 2 and FIG. 3, each pixel of the display element 110 may include a switching TFT 10, a driving TFT 20, a capacitor 80, and an organic light emitting diode 70. Here, a component including the switching TFT 10, the driving TFT 20, and the capacitor 80 is referred to as the driving circuit DC. The display element 110 may further include a gate line 151 arranged along one direction, a data line 171 crossing the gate line 151, and a common power line 172. The data line 171 is insulated from the gate line 151.

One pixel may be defined by the gate line 151, the data line 171, and the common line 172. However, embodiments are not limited to this embodiment.

The organic light emitting diode 70 may include a first electrode 710 serving as an anode, a second electrode 730 serving as a cathode, and an organic emission layer 720 disposed between the first electrode 710 and the second electrode 730. However, embodiments are not limited to this embodiment. Accordingly, the first electrode 710 may be a cathode electrode, and the second electrode 730 may be an anode electrode.

The flexible display 101 may be one of front, rear, and dual display types. If the flexible display 101 is of a front display type, the first electrode 710 may be formed from a reflective layer, and the second electrode 730 may be formed from a semi-transmissive layer. On the other hand, if the flexible display 101 is of a rear display type, the first electrode 710 may be formed from a semi-transmissive layer, and the second electrode 730 may be formed from a reflective layer. If the flexible display 101 is of a dual display type, the first electrode 710 and the second electrode 730 may be formed from a transparent layer or a semi-transmissive layer.

The reflective layer and the semi-transmissive layer may be made of at least one metal of magnesium (Mg), silver (Ag), gold (Au), calcium (Ca), lithium (Li), chromium (Cr), and aluminum, or an alloy thereof. It may be determined whether the first electrode 710 and the second electrode 730 are formed from the reflective layer or the semi-transmissive layer according to the thickness. In general, the semi-transmissive layer has a thickness of less than 200 nm. As the semi-transmissive layer becomes thinner, the level of transmittance of light through the semi-transmissive layer becomes higher. As the semi-transmissive layer becomes thicker, the level of transmittance of light through the semi-transmissive layer becomes lower.

The transparent layer may be made of indium tin oxide, indium zinc oxide, zinc oxide (ZnO), or indium oxide ($In_2O_3$).

In addition, the organic emission layer 720 may be formed from multiple layers including one or more of an emission layer, a hole injection layer (HIL), a hole transport layer (HTL), an electron transport layer (ETL), and an electron injection layer (EIL). If the organic emission layer 720 includes all of these layers, the hole injection layer may be disposed on the first electrode 710 serving as an anode, and then the hole transport layer, the emission layer, the electron transport layer, and the electron injection layer may be sequentially stacked on the hole injection layer. Further, the organic emission layer 720 may further include another layer, if necessary.

In this manner, the organic light emitting diode 70 may have holes and electrons injected into the organic emission layer 720 through the first electrode 710 and the second electrode 730, respectively. When excitons formed by recombination of the injected holes and electrons drop from an excited state to a ground state, the organic light emitting diode 70 may emit light.

The capacitor 80 may include a pair of capacitor plates 158 and 178 between which insulating layer 160 is interposed as an interlayer. Here, the insulating layer 160 is made of a dielectric material. Storage capacity is determined by electric charges stored in the capacitor 80 and a voltage potential difference between the capacitor plates 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a drain electrode 177.

The switching TFT 10 may be used as a switching element to select a pixel to emit light. The switching gate electrode 152 is connected to the gate line 151. The switching source electrode 173 is connected to the data line 171.

The switching drain electrode 174 may be spaced apart from the switching source electrode 173 and connected to one of the capacitor plates 158.

The driving TFT 20 may apply driving power to the pixel electrode 710 to emit light from the organic emission layer 720 of the organic light emitting diode 70 in a selected pixel. The driving gate electrode 155 may be connected to the capacitor plate 158 connected to the switching drain electrode 174. The driving source electrode 176 and the other capacitor plate 178 may be connected to the common power line 172. The driving drain electrode 177 may be connected to the pixel electrode 710 of the organic light emitting diode 70 through a contact hole.

With the above-described configuration, the switching TFT 10 may be driven by a gate voltage applied to the gate line 151, and supply a data voltage applied to the data line 171 to the driving TFT 20. A common voltage is supplied from the common power line 172 to the driving TFT 20. A data voltage is supplied from the switching TFT 10. A voltage corresponding to a difference between the common voltage and the data voltage may be stored in the capacitor 80. A current corresponding to the voltage stored in the capacitor 80 may flow into the organic light emitting diode 70 through the driving TFT 20 to make the organic light emitting diode 70 emit light.

Additionally, the flexible display 101 may further include a thin film encapsulation layer 210 formed on the flexible substrate 111. The thin film encapsulation layer 210 may cover the display element 110 and a barrier film 120 disposed between the display element 110 and the flexible substrate 111.

Figure 4:
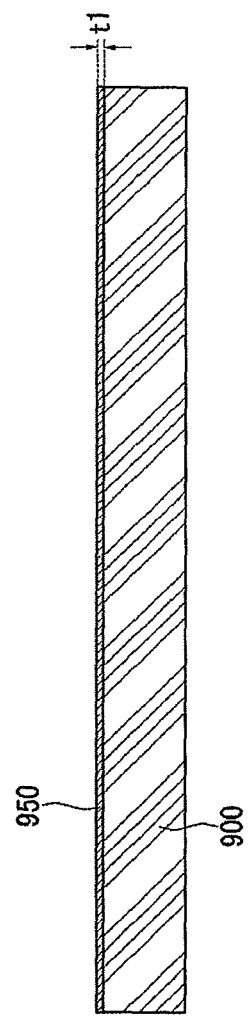
FIGS. 4-7 illustrate cross-sectional views of the flexible display illustrated in FIG. 1 in sequential manufacturing processes.

The thin film encapsulation layer 210 may include at least one of inorganic films 211, 213, and 215, and at least one of organic films 212 and 214. In the thin film encapsulation layer 210, the inorganic films 211, 213, and 215 and the organic films 212 and 214 may be alternately stacked. The inorganic film 211 may be disposed in the lowermost portion. That is, the inorganic film 211 may be disposed closest to the organic light emitting diode 70. FIG. 4 illustrates that the thin film encapsulation layer 210 includes three inorganic films 211, 213, and 215 and two organic films 212 and 214. However, embodiments are not limited to this embodiment.

The inorganic films 211, 213, and 215 may be formed from at least one inorganic material of $Al_2O_3$, $TiO_2$, $ZrO$, $SiO_2$, AlON, AlN, SiON, $Si_3N_4$, ZnO, and $Ta_2O_5$. The inorganic films 211, 213, and 215 may be formed by chemical vapor deposition or atomic layer deposition. Of these methods, the atomic layer deposition may make it possible to grow and produce the aforementioned inorganic materials at a temperature of less than 100° C. so as to prevent damage of the organic light emitting diode 70. In addition, the inorganic films 211, 213, and 215 formed by the atomic layer deposition may effectively suppress permeation of moisture or oxygen because the thin films have high densities. However, embodiments are not limited to this embodiment. The inorganic films 211, 213, and 215 may be formed by various methods that are well known to those of ordinary skill in the art.

The organic films 212 and 214 may be made of polymer-based material. The polymer-based material may be acrylic resin, epoxy resin, polyimide, polyethylene, etc. The organic films 212 and 214 may be formed by a thermal deposition process. To form the organic films 212 and 214, the thermal deposition process may be carried out in a temperature range in which the organic light emitting diode 70 may not be damaged. However, embodiments are not limited to this embodiment. The organic films 212 and 214 may be formed by various methods that are well known to those of ordinary skill in the art.

The inorganic films 211, 213, and 215 having high thin film densities may suppress permeation mainly of moisture or oxygen. The inorganic films 211, 213, and 215 may prevent most of moisture and oxygen from permeating into the organic light emitting diode 70.

Moisture and oxygen passing through the inorganic films 211, 213, and 215 may be blocked by the organic films 212 and 214. The organic films 212 and 214 may have a relatively low ability of preventing moisture permeation compared to the inorganic films 211, 213, and 215. However, the organic films 212 and 214 also serve as a buffer layer for reducing stress between the layers caused by the bending of the organic light emitting display 101 between the inorganic films 211, 213, and 215 and the inorganic films 211, 213, and 215, as well as serving to suppress moisture permeation. That is, if the inorganic films 211, 213, and 215 are consecutively formed directly on the inorganic films 211, 213, and 215 without the organic films 212 and 214 interposed therebetween, when the organic light emitting display 101 is bent, stress is generated between the inorganic films 211, 213, and 215 and the inorganic films 211, 213, and 215. This stress may cause damages to the inorganic films 211, 213, and 215. Consequently, the function of the thin film encapsulation layer 210 of preventing moisture permeation may be significantly degraded. In this way, the organic films 212 and 214 may serve as buffer layers as well as serving to suppress moisture permeation. Accordingly, the thin film encapsulation layer 210 may stably prevent permeation of moisture or oxygen. Also, because the organic films 212 and 214 have planarization characteristics, the uppermost surface of the thin film encapsulation layer 210 may be planarized.

Moreover, a thin film encapsulation layer having a thickness of less than 10 μm may be formed. Thus, the overall thickness of the flexible display 101 may be very small.

In addition, flexibility of the flexible display 101 may be maximized by using the thin film encapsulation layer 210.

The barrier film 120 may be formed from at least one of various inorganic films and organic films.

The formed thin film encapsulation layer 210 and barrier film 120 may preferably have a water vapor transmission rate (WWTR) of less than $10^{-6}$ g/m$^2$/day in order to prevent unnecessary elements from permeating into the organic light emitting diode 70. The unnecessary elements include moisture permeated into the organic light emitting diode 70 because such moisture may shorten a life span of the organic light emitting diode 70.

With the above-described configuration, the flexible display 101 may effectively suppress generation of a defect.

Hereinafter, a method for manufacturing the flexible display 101 as illustrated in FIG. 1 will be described with reference to FIGS. 4 to 7.

First, as illustrated in FIG. 4, a glass substrate 900 may be prepared, and then an adhesive material film 950 may be formed on the glass substrate 900.

The adhesive material film 950 may have the same constituents as the surface residual film 109 of the flexible display 101 illustrated in FIG. 1. That is, the adhesive material film 950 may be made of at least one of a metal material or a metal oxide material.

Further, the adhesive material film 950 may contain a material that may be bonded to the functional group of —CONH—. Specifically, the adhesive material film 950 may contain at least one metal material including at least one of aluminum, gallium, indium, titanium, molybdenum or zinc. The adhesive material film 950 may contain at least one metal oxide material including at least one of aluminum oxide, gallium oxide, zinc oxide, titanium oxide, indium oxide, indium tin oxide, indium zinc oxide, and gallium indium zinc oxide.

The adhesive material film 950 may be formed by sputtering, chemical vapor deposition (CVD), or atomic layer deposition. Among these methods, the atomic layer deposition may be appropriate because the adhesive film material 950 may be formed uniformly and clearly without particles. Also, in the case of using the atomic layer deposition, the adhesive material film 950 may be formed to be not only uniform but also relatively thin. However, a deposition speed of the atomic layer deposition is very low, i.e., approximately 0.5 Å to 2 Å per cycle. Taking these characteristics of the atomic layer deposition into account, the adhesive material film 950 may be formed to have a thickness t1 ranging from 0.1 nm to 1000 nm. The adhesive material film 950 may be formed to be thick enough to cover the surface of the glass substrate 900 for surface treatment of the glass substrate 900. Thus, if the adhesive material film 900 is too thick, the overall production efficiency of the flexible display 101 may be deteriorated due to a relatively low deposition speed of the atomic layer deposition. To this end, the adhesive material film 950 may be preferably formed to have a thickness t1 of less than 1000 nm.

Figure 5:
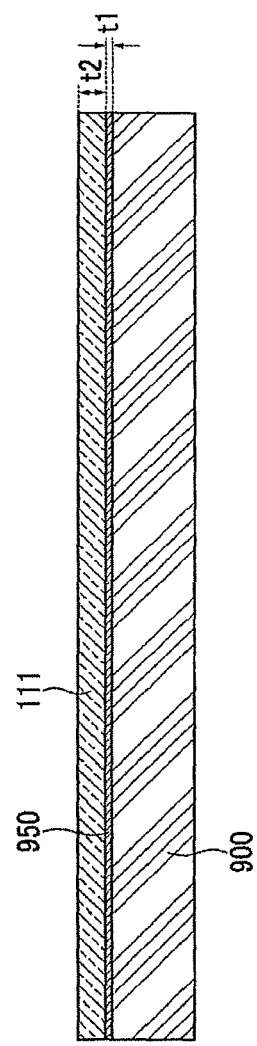

Next, as illustrated in FIG. 5, a flexible substrate 111 may be formed on the adhesive material film 111. The flexible substrate 111 may be made of plastic material containing the functional group of —CONH—. In the manufacturing method according to the embodiment, the flexible substrate 111 may be formed of polyimide containing the functional group of —CONH—. Polyimide is particularly excellent in heat resistance. Since the flexible display 101 has to undergo a number of high-temperature processes, polyimide may be suitable as a raw material of the flexible substrate 111 of the flexible display 101.

The flexible substrate 111 may be formed by either a slit coating method or a screen printing method. That is, the polyimide may be coated on the adhesive material film 950 by the slit coating method or the screen printing method, and the flexible substrate 111 may be formed accordingly. At this point, the functional group of —CONH— contained in the flexible substrate 111 may be firmly bonded to the adhesive material film 950. In general, metal material or metal oxide material has very good adhesion force to the glass substrate 900. Accordingly, the flexible substrate 111 and the glass substrate 900 may be stably adhered to each other by the adhesive material film 950.

Also, the flexible substrate 111 may be formed so as to have a thickness t2 ranging from 5 μm to 200 μm due to a manufacturing environment or the flexible characteristics. Specifically, the flexible substrate 111 having a thickness t2 of approximately 10 μm may be formed from polyimide by the slit coating method, for example. Alternatively, the flexible substrate 111 having a thickness t2 ranging from approximately 10 μm to 70 μm may be formed from polyimide by the screen printing method.

The flexible substrate 111 may be formed so as to have the same CTE as the glass substrate 900 or a CTE of less than 10 ppm/° C. The glass substrate 900 has a CTE of approximately 4 ppm/° C. The flexible substrate 111 and the glass substrate should be stably bonded to each other. If a difference in a CTE between the flexible substrate 111 and the glass substrate 900 becomes too large, the flexible substrate 111 may be peeled off from the glass substrate 900 during a high-temperature process. This may cause a defect in the manufacturing process.

Even if there is a difference in the CTE between the flexible substrate 111 and the glass substrate 900, the flexible substrate 111 and the glass substrate 900 may be effectively bonded to each other, and thus enable stable manufacture of the flexible display 101.

Figure 6:
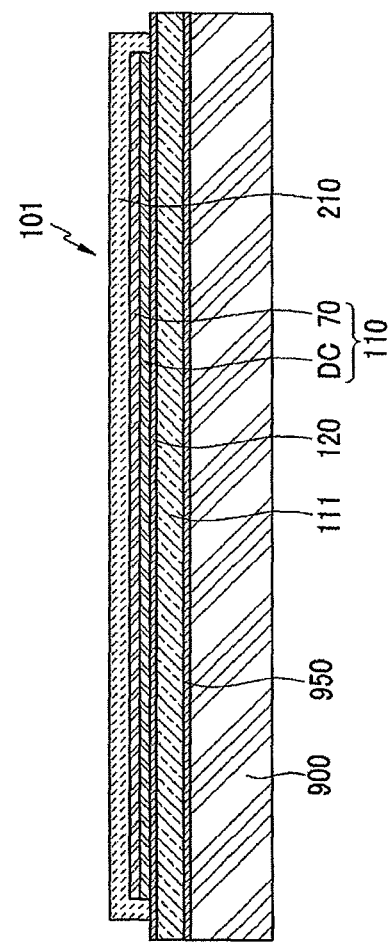

Next, as illustrated in FIG. 6, a barrier film 120 may be formed on the flexible substrate 111, and a display element 110 may be formed on the barrier film 120. Then, a thin film encapsulation layer 210 for covering the display element 110 may be formed on the flexible substrate 111. Here, the barrier film 120 and the thin film encapsulation layer 210 may be omitted if necessary according to the type of the display element 110. In addition, their configuration on the flexible substrate 111 may vary according to the type of the display element 110.

FIG. 6 illustrates that the display element 110 is an organic light emitting element. However, embodiments are not limited to this embodiment. Thus, the display element may be either a liquid crystal display device or an EPD device if a display device is not an organic light emitting diode display device. Further, these display elements 110 commonly include TFTs. Thus, in the manufacturing process of the flexible display 101, the flexible substrate 111 and the glass substrate 900 may undergo a number of high-temperature processes, while being bonded to each other.

Figure 7:
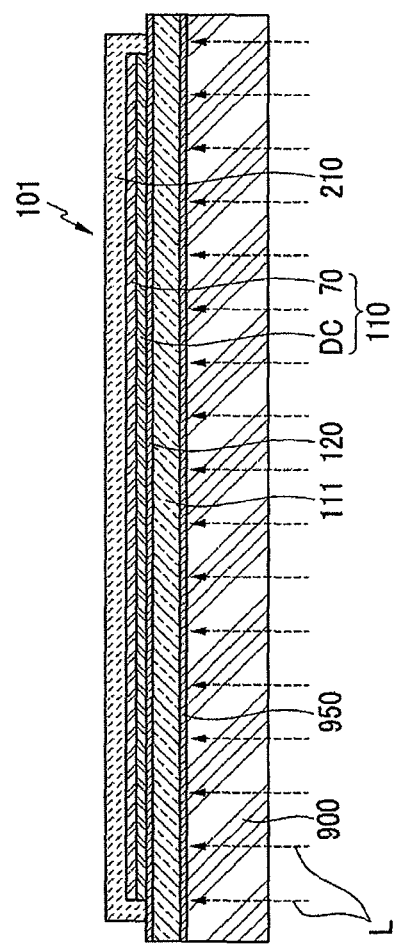

Next, as illustrated in FIG. 7, a laser light L may be irradiated to separate the flexible substrate 111 and the glass substrate 900 from each other. Specifically, by radiation of laser light, the flexible substrate 111 and the adhesive material film 950 may be separated from each other, or the adhesive material film 950 and the glass substrate 900 may be separated from each other.

In this manner, the flexible substrate 111 and the glass substrate 900 may be separated, and the flexible display 101 may be completed. In the flexible display 101 manufactured according to the exemplary embodiment, as illustrated in FIG. 1, at least part of the metal material or metal oxide material bonded to the flexible substrate 111 may remain bonded to the flexible substrate 111.

By the above-described method for manufacturing the flexible display 101, the flexible display 101 may be stably manufactured by effectively improving the bonding force between the flexible substrate 111 and the glass substrate 900.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method for manufacturing a flexible display, the method comprising:
preparing a glass substrate;

forming an adhesive material film directly on the glass substrate, the adhesive material film consisting of aluminum oxide forming a flexible substrate from a plastic material on the adhesive material film, wherein the plastic material is formed from a material including a polyimide that includes —CONH— as a functional group;

forming a display element on the flexible substrate; and separating the flexible substrate and the glass substrate from each other by irradiation of laser light.

2. The method as claimed in claim 1, wherein the flexible substrate is formed by a slit coating method or a screen printing method.

3. The method as claimed in claim 2, wherein the flexible substrate has a thickness ranging from 5 μm to 200 μm.

4. The method as claimed in claim 1, wherein the flexible substrate has the same coefficient of thermal expansion as the glass substrate.

5. The method as claimed in claim 1, wherein the flexible substrate has a coefficient of thermal expansion of less than 10 ppm/° C.

6. The method as claimed in claim 1, wherein the aluminum oxide bonds to the functional group of —CONH—.

7. The method as claimed in claim 6, wherein the adhesive material film is formed by atomic layer deposition.

8. The method as claimed in claim 7, wherein the adhesive material film has a thickness ranging from 0.1 nm to 1000 nm.

9. The method as claimed in claim 1, wherein the irradiation of laser light separates the flexible substrate and the glass substrate from each other by separating the flexible substrate from the adhesive material film.

10. The method as claimed in claim 1, wherein the irradiation of laser light separates the flexible substrate and the glass substrate from each other by separating the adhesive material film from the glass substrate.

11. The method as claimed in claim 1, wherein the display element includes a thin film transistor.

12. The method as claimed in claim 11, wherein the display element is any one of an organic light emitting diode display device, a liquid crystal display device, and an electrophoretic display device.

* * * * *